(12) United States Patent
Tang et al.

(10) Patent No.: US 12,666,806 B2
(45) Date of Patent: Jun. 23, 2026

(54) DISPLAY SUBSTRATE AND MANUFACTURING METHOD THEREOF, AND DISPLAY DEVICE

(71) Applicants:Chengdu BOE Optoelectronics Technology Co., Ltd., Chengdu (CN); BOE Technology Group Co., Ltd., Beijing (CN)

(72) Inventors: Guoqiang Tang, Beijing (CN); Baolei Huo, Beijing (CN); Jundan Zhou, Beijing (CN); Yang Wang, Beijing (CN); Longfeng Jiang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 399 days.

(21) Appl. No.: 18/269,163

(22) PCT Filed: Sep. 1, 2022

(86) PCT No.: PCT/CN2022/116431
§ 371 (c)(1),
(2) Date: Jun. 22, 2023

(87) PCT Pub. No.: WO2024/045105
PCT Pub. Date: Mar. 7, 2024

(65) Prior Publication Data
US 2024/0397751 A1 Nov. 28, 2024

(51) Int. Cl.
H10K 59/122 (2023.01)
H10K 59/00 (2023.01)
(Continued)

(52) U.S. Cl.
CPC ....... H10K 59/122 (2023.02); H10K 59/1201 (2023.02); H10K 59/771 (2023.02); H10K 59/8792 (2023.02)

(58) Field of Classification Search
CPC ............. H10K 59/122; H10K 59/1201; H10K 59/771; H10K 59/8792
(Continued)

(56) References Cited

U.S. PATENT DOCUMENTS

2004/0085014 A1 5/2004 Park et al.
2005/0236975 A1 10/2005 Addington et al.
(Continued)

FOREIGN PATENT DOCUMENTS

CN 1499902 A 5/2004
CN 1873951 A 12/2006
(Continued)

OTHER PUBLICATIONS

World Intellectual Property Organization (WIPO) Search (Year: 2024).*
(Continued)

*Primary Examiner* — James R Greece
*Assistant Examiner* — Hana S Featherly
(74) *Attorney, Agent, or Firm* — WHDA, LLP

(57) ABSTRACT

A display substrate and a manufacturing method thereof, and a display device, relate to the technical field of displaying. The display substrate includes a base substrate; a pixel defining layer; and a common transport layer arranged at one side of the pixel defining layer away from the base substrate, including a first blocking pattern and first transport patterns located at two sides of the first blocking pattern; the first blocking pattern and the first transport pattern at least including one identical element, material structures of the first blocking pattern and the first transport pattern are
(Continued)

different, and a lateral resistance of the first blocking pattern is greater than a lateral resistance of the first transport pattern.

20 Claims, 6 Drawing Sheets

(51) Int. Cl.
*H10K 59/12*            (2023.01)
*H10K 59/80*            (2023.01)

(58) Field of Classification Search
USPC ......................................................... 313/500
See application file for complete search history.

(56)                    References Cited

U.S. PATENT DOCUMENTS

| | | | | |
|---|---|---|---|---|
| 2015/0069361 | A1 | 3/2015 | Sato et al. | |
| 2015/0372063 | A1* | 12/2015 | Lee ...................... | H10K 59/122 |
| | | | | 257/40 |
| 2016/0155785 | A1 | 6/2016 | Sato | |
| 2016/0380035 | A1 | 12/2016 | Cho et al. | |

FOREIGN PATENT DOCUMENTS

| | | |
|---|---|---|
| CN | 105655377 A | 6/2016 |
| CN | 106207015 A | 12/2016 |
| CN | 106298847 A | 1/2017 |
| CN | 110379839 A | 10/2019 |
| CN | 111710789 A | 9/2020 |
| CN | 111710792 A | 9/2020 |
| CN | 112701146 A | 4/2021 |
| CN | 215731779 U | 2/2022 |
| CN | 114361373 A | 4/2022 |

OTHER PUBLICATIONS

Office Action dated Jan. 29, 2026, issued in counterpart CN Application 202280002982.0, with English translation. (35 pages).

* cited by examiner

DISPLAY SUBSTRATE AND MANUFACTURING METHOD THEREOF, AND DISPLAY DEVICE

TECHNICAL FIELD

The present disclosure relates to the technical field of displaying and, more particularly, to a display substrate and a manufacturing method thereof, and a display device.

BACKGROUND

An Organic Light Emitting Diode (OLED) is an active light emitting display device, which has the advantages of self-luminescence, wide viewing angle, high contrast, low power consumption, wide color gamut, thinness and ability of being irregular-shaped.

SUMMARY

The present disclosure provides a display substrate, including:

a base substrate;

a pixel defining layer arranged at one side of the base substrate, the pixel defining layer being configured for defining a plurality of opening areas; and a common transport layer arranged at one side of the pixel defining layer away from the base substrate, including: a first blocking pattern and first transport patterns located at two sides of the first blocking pattern;

wherein the first blocking pattern and the first transport pattern at least include one identical element, a material structure of the first blocking pattern is different from a material structure of the first transport pattern, and a lateral resistance of the first blocking pattern is greater than a lateral resistance of the first transport pattern; and an orthographic projection of the first blocking pattern on the base substrate is located within an orthographic projection range of the pixel defining layer on the base substrate, and an orthographic projection of the first transport pattern on the base substrate covers orthographic projections of at least two adjacent opening areas on the base substrate and an orthographic projection of at least part of the pixel defining layer between the at least two adjacent opening areas on the base substrate.

In some optional embodiments, a thickness of the first blocking pattern is less than or equal to a thickness of the first transport pattern; and/or the first blocking pattern and the first transport pattern are separated from each other at a junction position; and/or a mass percentage of oxygen in the first blocking pattern is higher than a mass percentage of oxygen in the first transport pattern.

In some optional embodiments, a boundary of the first transport pattern includes at least one of the following: sawtooth, warping, curling, fraze and burr.

In some optional embodiments, the first blocking pattern is a closed structure or a non-closed structure surrounding the opening area by one circle.

In some optional embodiments, the first blocking pattern includes a central area and an edge area surrounding the central area:

wherein a thickness of the pixel defining layer covered by the central area is less than or equal to a thickness of the pixel defining layer covered by the edge area; and/or, a mass percentage of oxygen in a surface layer of the pixel defining layer covered by the central area is higher than a mass percentage of oxygen in a bottom layer of the pixel defining layer.

In some optional embodiments, the display substrate further includes:

a first electrode layer arranged between the base substrate and the pixel defining layer, including a first electrode, wherein an orthographic projection of the first electrode on the base substrate covers an orthographic projection of a first opening area on the base substrate, and the first opening area is any one of the at least two adjacent opening areas;

wherein a distance between an orthographic projection of a junction between the first blocking pattern and the first transport pattern on the base substrate and an orthographic projection boundary of the first electrode on the base substrate is less than or equal to 2 microns; or, the orthographic projection of the junction between the first blocking pattern and the first transport pattern on the base substrate is indented toward a direction close to the first opening area relative to the orthographic projection boundary of the first electrode on the base substrate.

In some optional embodiments, the at least two adjacent opening areas include a first opening area and a second opening area, and the pixel defining layer arranged between the first opening area and the second opening area includes: a first defining portion and a second defining portion separated from each other:

wherein an isolation column is further arranged between the first defining portion and the second defining portion, the first defining portion is located between the isolation column and the first opening area, and the second defining portion is located between the isolation column and the second opening area; and the orthographic projection of the first blocking pattern and an orthographic projection of the isolation column on the base substrate intersect or overlap.

In some optional embodiments, a surface height of the isolation column at the side away from the base substrate is lower than surface heights of the first defining portion and the second defining portion at the side away from the base substrate.

In some optional embodiments, the isolation column and the first defining portion are separated from each other, and the isolation column and the second defining portion are separated from each other.

In some optional embodiments, the isolation column is made of a same material as the pixel defining layer.

In some optional embodiments, the common transport layer includes at least one of the followings: a hole injection layer, a hole transport layer, a charge generation layer, a light emitting layer, an electron transport layer and an electron injection layer that are arranged in layer configuration.

In some optional embodiments, the display substrate further includes:

a second electrode layer arranged at one side of the common transport layer away from the base substrate, including: a second blocking pattern and second transport patterns located at two sides of the second blocking pattern;

wherein a thickness of the second blocking pattern is less than a thickness of the second transport pattern; and an orthographic projection of the second blocking pattern on the base substrate is located within the orthographic projection range of the pixel defining layer on the base substrate, and an orthographic projection of the second transport pattern on the base substrate covers the orthographic projections of the at least two adjacent opening areas on the base substrate and the orthographic projection of at least part of the pixel defining layer between the at least two adjacent opening areas on the base substrate.

In some optional embodiments, the orthographic projection of the first blocking pattern on the base substrate at least partially intersects or overlaps with the orthographic projection of the second blocking pattern on the base substrate.

In some optional embodiments, a boundary of the second transport pattern includes at least one of the following: sawtooth, warping, curling, fraze and burr.

In some optional embodiments, the boundary of the first transport pattern and the boundary of the second transport pattern warp toward the same direction.

In some optional embodiments, the second blocking pattern and the second transport pattern have at least one same material.

In some optional embodiments, the second blocking pattern is a non-closed structure surrounding the opening area by one circle, and the second electrode layer further includes connecting lines and a signal line, the connecting lines are configured for communicating the second transport pattern and the signal line.

In some optional embodiments, the second electrode layer includes the plurality of connecting lines and the plurality of connecting lines are irregularly arranged.

In some optional embodiments, the display substrate includes a first active area and a second active area, the first active area and the second active area are configured for displaying frames, and the first active area is further configured for transmitting ambient light:

wherein the orthographic projection of the second blocking pattern on the base substrate is located in the first active area.

The present disclosure provides a display substrate, including:

a base substrate;

a pixel defining layer arranged at one side of the base substrate, the pixel defining layer being configured for defining a plurality of opening areas, and the pixel defining layer located between at least two adjacent opening areas including: a third defining portion and fourth defining portions located at two sides of the third defining portion, wherein a transmittance of the third defining portion is less than a transmittance of the fourth defining portion; and a common transport layer arranged at one side of the pixel defining layer away from the base substrate, including:

a first blocking pattern and first transport patterns located at two sides of the first blocking pattern, a lateral resistance of the first blocking pattern being greater than a lateral resistance of the first transport pattern;

wherein an orthographic projection of the first blocking pattern on the base substrate is located within an orthographic projection range of the pixel defining layer on the base substrate, and an orthographic projection of the first blocking pattern on the base substrate covers an orthographic projection of the third defining portion on the base substrate; and an orthographic projection of the first transport pattern on the base substrate covers orthographic projections of the at least two adjacent opening areas on the base substrate, and an orthographic projection of at least part of the pixel defining layer between the at least two adjacent opening areas on the base substrate.

In some optional embodiments, a surface roughness of the third defining portion at one side away from the base substrate is greater than a surface roughness of the fourth defining portion at one side away from the base substrate.

In some optional embodiments, a mass percentage of oxygen of the third defining portion is greater than a mass percentage of oxygen of the fourth defining portion.

In some optional embodiments, residual particles are present on a surface of the third defining portion at the side away from the base substrate, and the residual particles include metal.

In some optional embodiments, a concave structure is present on a surface of the third defining portion at the side away from the base substrate, and the concave structure is concave toward a side close to the base substrate.

The present disclosure provides a display device, including the display substrate according to any one of embodiments stated above.

The present disclosure provides a method for manufacturing a display substrate, including:

providing a base substrate;

forming a pixel defining layer at one side of the base substrate, the pixel defining layer being configured for defining a plurality of opening areas;

forming a common transport layer at one side of the pixel defining layer away from the base substrate, the common transport layer including: a first blocking pattern and first transport patterns located at two sides of the first blocking pattern;

wherein the first blocking pattern and the first transport pattern at least include one identical element, a material structure of the first blocking pattern is different from a material structure of the first transport pattern, and a lateral resistance of the first blocking pattern is greater than a lateral resistance of the first transport pattern; and an orthographic projection of the first blocking pattern on the base substrate is located within an orthographic projection range of the pixel defining layer on the base substrate, and an orthographic projection of the first transport pattern on the base substrate covers orthographic projections of at least two adjacent opening areas on the base substrate and an orthographic projection of at least part of the pixel defining layer between the at least two adjacent opening areas on the base substrate.

In some optional embodiments, the step of forming the common transport layer at the side of the pixel defining layer away from the base substrate includes:

forming a common transport material at the side of the pixel defining layer away from the base substrate, an orthographic projection of the common transport material on the base substrate covering the base substrate; and irradiating the common transport material with laser to form the common transport layer: wherein the first blocking pattern includes the common transport material irradiated by laser, and the first transport pattern includes a common transport material not irradiated by the laser.

In some optional embodiments, before the step of irradiating the common transport material with laser to form the common transport layer, the method further includes:

forming a second electrode material at one side of the common transport material away from the base substrate, an orthographic projection of the second electrode material on the base substrate covering the base substrate; and the step of irradiating the common transport material with laser to form the common transport layer includes:

irradiating the common transport material and the second electrode material with laser at a same time, to form the common transport layer and the second electrode layer: wherein the first blocking pattern includes the common transport material irradiated by the laser, and the first transport pattern includes the common transport material not irradiated by the laser: the second electrode layer includes a second blocking pattern and second transport patterns located at two sides of the second blocking pattern, the second blocking pattern includes the second electrode material irradiated by the laser, and the second transport pattern includes a second electrode material not irradiated by the laser.

In some optional embodiments, when a wavelength of the laser is less than or equal to 500 nanometers, the laser is injected from one side of the common transport material away from the base substrate; and when the wavelength of the laser is greater than 500 nanometers, the laser is injected from one side of the base substrate away from the common transport material; and/or one side of the common transport material away from the base substrate.

The above description is only a summary of technical schemes of the present disclosure, which can be implemented according to contents of the specification in order to better understand technical means of the present disclosure; and in order to make above and other objects, features and advantages of the present disclosure more obvious and understandable, detailed description of the present disclosure is particularly provided in the following.

BRIEF DESCRIPTION OF THE DRAWINGS

In order to more clearly illustrate the technical solutions of the embodiments of the present disclosure or the prior art, the figures that are required to describe the embodiments or the prior art may be briefly introduced below. Apparently, the figures that are described below are embodiments of the present disclosure, and a person skilled in the art can obtain other figures according to these figures without paying creative work. It should be noted that the proportions in the drawings are only indicative and do not represent actual proportions.

DETAILED DESCRIPTION

In order to make purposes, technical schemes and advantages of embodiments of this disclosure more clearer, the technical schemes in the embodiments of this disclosure will be described clearly and completely with reference to the drawings in the embodiments of this disclosure; and it is obvious that the described embodiments are part of the embodiments of this disclosure, but not all of them. On a basis of the embodiments in this disclosure, all other embodiments obtained by the ordinary skilled in the art without paying creative effort are within a protection scope of this disclosure.

Figure 1:
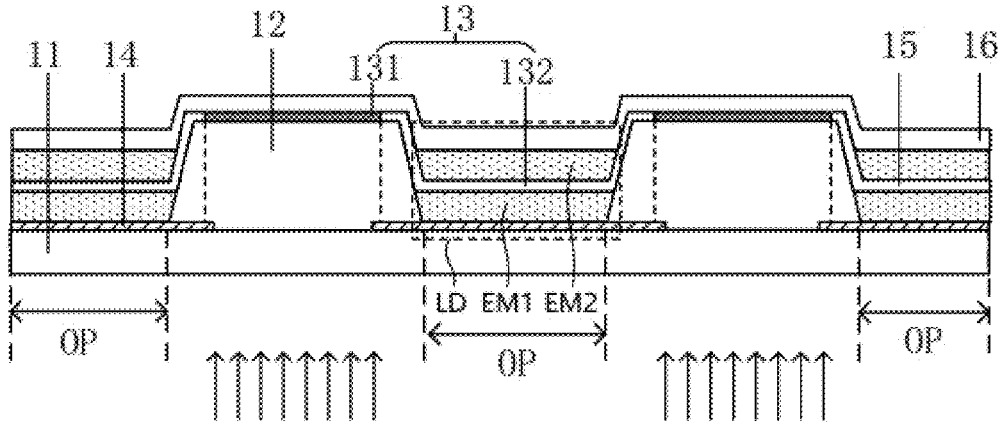
FIG. 1 schematically shows a schematic sectional structural diagram of a first display substrate provided by the present disclosure.

The present disclosure provides a display substrate. Referring to FIG. 1, FIG. 1 schematically shows a schematic sectional structural diagram of a display substrate according to the present disclosure. As shown in FIG. 1, the display substrate includes: a base substrate 11: a pixel defining layer 12 arranged at one side of the base substrate 11, the pixel defining layer 12 being configured for defining a plurality of opening areas OP; and a common transport layer 13 arranged at one side of the pixel defining layer 12 away from the base substrate 11.

The common transport layer 13 includes: a first blocking pattern 131 and first transport patterns 132 located at two sides of the first blocking pattern 131. The first blocking pattern 131 and the first transport pattern 132 at least include one identical element, a material structure of the first blocking pattern 131 is different from a material structure of the first transport pattern 132, and a lateral resistance of the first blocking pattern 131 is greater than a lateral resistance of the first transport pattern 132.

Illustratively, the identical element above may include at least one of the following: metallic elements such as ytterbium, lithium, copper, molybdenum, neodymium, magnesium and silver, and nonmetallic elements such as fluorine, carbon and oxygen.

Proportions of the identical element in the first blocking pattern 131 and the first transport pattern 132 may be the same or different. Illustratively, a proportion of the metallic element in the first blocking pattern 131 may be less than a proportion of the metallic element in the first transport pattern 132.

An orthographic projection of the first blocking pattern 131 on the base substrate 11 is located within an orthographic projection range of the pixel defining layer 12 on the base substrate 11, and an orthographic projection of the first transport pattern 132 on the base substrate 11 covers orthographic projections of at least two adjacent opening areas OP on the base substrate 11 and an orthographic projection of at least part of the pixel defining layer 12 between the at least two adjacent opening areas OP on the base substrate 11.

The lateral resistance of the first blocking pattern 131 is a magnitude of a blocking effect of the first blocking pattern 131 on a lateral current. The lateral resistance of the first transport pattern 132 is a magnitude of a blocking effect of the first transport pattern 132 on the lateral current. The lateral current is the current transmitted in a plane where the common transport layer 13 is located.

Since the lateral resistance of the first blocking pattern 131 is greater than the lateral resistance of the first transport pattern 132, the first blocking pattern 131 plays a role in obstructing or blocking the lateral current.

As the two adjacent opening areas OP are covered with the first transport pattern 132, by arranging the first blocking pattern 131 on the pixel defining layer 12 between the two adjacent opening areas OP, carrier transport between the first transport patterns 132 located at both sides of the first blocking pattern 131 can be blocked, thereby blocking the carrier transport between the two adjacent opening areas OP, a signal crosstalk problem between sub-pixels corresponding to different opening areas OP is improved, passive lighting of adjacent sub-pixels when a certain sub-pixel is lit is avoided, and a display effect is improved.

The opening area OP is configured for arranging a light emitting device LD. The light emitting device LD may be an organic light-emitting diode (OLED), a mini light-emitting diode (Mini LED), a micro light-emitting diode (Micro LED), a quantum dot light-emitting diode (QLED), and the like, which is not limited by the present disclosure.

In specific implementation, a layer of common transport material may be formed by evaporation at one side of the pixel defining layer 12 away from the base substrate 11, and an orthographic projection of the common transport material on the base substrate 11 can cover the base substrate 11. After that, the common transport material in the first blocking pattern 131 may be treated by the laser ablation, chemical etching or ion implantation, such that the common transport material in the first blocking pattern 131 is denatured (reactions such as carbonization, oxidation, molecular chain cracking or crosslinking), gasified or subjected to a combination of denaturation and gasification. The denaturation of the common transport material can increase a resistivity of the material in the first blocking pattern 131, and the gasification of the common transport material can reduce a thickness of the first blocking pattern 131, both of which can realize that the lateral resistance of the first blocking pattern 131 is greater than the lateral resistance of the first transport pattern 132.

Illustratively, the common transport material is an organic material doped with metal element (such as ytterbium). When the common transport material is irradiated with laser, the metal element in the common transport material may be gasified, oxidized or subjected to a combination of gasification and oxidation, so a thickness of the common transport material after laser irradiation may be reduced, or a mass percentage of oxygen may be increased, or a proportion of metal element may be decreased.

Optionally, a thickness of the first blocking pattern 131 is less than or equal a thickness of the first transport pattern 132. By thinning the thickness of the first blocking pattern 131, a cross-sectional area of the first blocking pattern 131 can be reduced, so that a transport resistance of the lateral current can be increased.

Optionally, the first blocking pattern 131 and the first transport pattern 132 are separated from each other at a junction position. When the common transport material in the first blocking pattern 131 is irradiated with laser, a boundary of the first transport pattern 132 may warp or curl under the action of a thermal stress, so that the first blocking pattern 131 can be separated from the first transport pattern 132, a contact resistance between the first blocking pattern 131 and the first transport pattern 132 can be increased, and a signal crosstalk problem between different sub-pixels can be further improved.

Optionally, a mass percentage of oxygen of the first blocking pattern 131 is higher than a mass percentage of oxygen of the first transport pattern 132.

Optionally, the first blocking pattern 131 includes a denatured first material, and the first material is the same as a material of the first transport pattern 132. The denatured first material includes a carbonized first material, an oxidized first material, or a first material with a molecular chain which is cracked or cross-linked, and the like, which is not limited by the present disclosure.

Optionally, the first blocking pattern 131 further includes a residual first material.

Optionally, the boundary of the first transport pattern 132 includes at least one of the following: sawtooth, warping, curling, fraze and burr.

The boundary of the first transport pattern 132 may warp toward a direction close to or away from the base substrate 11. When a laser process is used, a warping direction of the boundary of the first transport pattern 132 is the same as a laser irradiation direction. For example, when the laser is irradiated from one side of the common transport layer 13 away from the base substrate 11, the boundary of the first transport pattern 132 warps toward the direction close to the base substrate 11. When the laser is irradiated from one side of the base substrate 11 away from the common transport layer 11, the boundary of the first transport pattern 132 warps toward the direction away from the base substrate 11.

Figure 6:
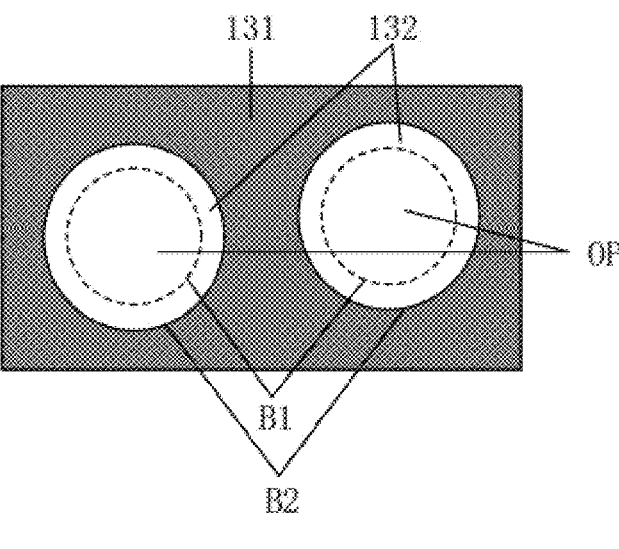
FIG. 6 schematically shows a schematic structural diagram of a plane of a display substrate provided by the present disclosure.

Optionally, as shown in FIG. 6, the first blocking pattern 131 is a closed structure surrounding the opening area OP by one circle. In this way, the carrier transport between the first transport patterns 132 located at the two sides of the first blocking pattern 131 can be completely blocked, thereby the carrier transport between two adjacent opening areas OP is blocked, and the signal crosstalk problem between different sub-pixels is improved.

In FIG. 6, B1 is a boundary between the opening area OP and a non-opening area, and B2 is a junction between the first blocking pattern 131 and the first transport pattern 132, or the boundary of the first transport pattern 132.

Certainly, the first blocking pattern 131 may also be a non-closed structure surrounding the opening area OP by one circle, which is not limited by the present disclosure.

Figure 2:
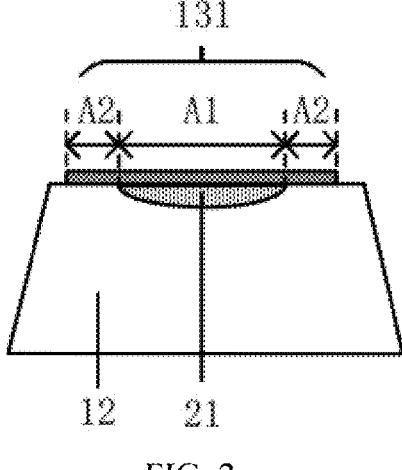
FIG. 2 schematically shows a schematic sectional structural diagram of a partial display substrate provided by the present disclosure.

Optionally, as shown in FIG. 2, the first blocking pattern 131 includes a central area A1 and an edge area A2 surrounding the central area A1. When the common transport material in the first blocking pattern 131 is cut with laser, laser energy is in the form of Gaussian distribution, that is, the laser energy in the central area A1 is larger and the laser energy in the edge area A2 is smaller, resulting in a larger cutting depth in the central area A1 and a smaller cutting depth in the edge area A2.

In order to ensure that the common transport material in the edge area A2 is completely cut off, a pixel defining material in a part of the pixel defining layer 12 covered by the central area A1, such as a top area 21 shown in FIG. 2, may be denatured, gasified or subjected to a combination of denaturation and gasification.

If the pixel defining material in the top area 21 is gasified, a thickness of the pixel defining layer 12 covered by the central area A1 is less than or equal to a thickness of the pixel defining layer 12 covered by the edge area A2.

If the pixel defining material in the top area 21 is denatured, the pixel defining layer 12 covered by the central area A1 includes a denatured second material, and the second material is the same as the material of the pixel defining layer 12 covered by the edge area A2. The denatured second material includes a carbonized second material, an oxidized second material, or a second material with a molecular chain which is cracked or cross-linked, and the like, which is not limited by the present disclosure.

Optionally, a mass percentage of oxygen in a surface layer of the pixel defining layer covered by the central area A1 (the top area 21 as shown in FIG. 2) is higher than a mass percentage of oxygen in a bottom layer (below the top area 21 as shown in FIG. 2) of the pixel defining layer.

Optionally, as shown in FIG. 1, the display substrate includes: a first electrode 14 layer arranged between the base substrate 11 and the pixel defining layer 12, including a first electrode 14, wherein an orthographic projection of the first electrode 14 on the base substrate 11 covers an orthographic projection of a first opening area on the base substrate 11, and the first opening area is any opening area OP of the at least two adjacent opening areas OP.

A distance between an orthographic projection of the junction between the first blocking pattern 131 and the first transport pattern 132 on the base substrate 11 and an orthographic projection boundary of the first electrode 14 on the base substrate 11 is less than or equal to 2 microns. Optionally, as shown in FIG. 1, the orthographic projection of the junction between the first blocking pattern 131 and the first transport pattern 132 on the base substrate 11 is indented toward a direction close to the first opening area OP1 relative to the orthographic projection boundary of the first electrode 14 on the base substrate 11.

In an optional implementation, the laser may be used to irradiate from one side of the base substrate 11 away from the common transport layer 13, and the first electrode 14 layer or a shielding layer of the first electrode 14 layer may shield the laser from the opening area OP, thus avoiding the laser from damaging a light emitting device LD in the opening area OP. Using the first electrode 14 layer or the shielding layer of the first electrode 14 layer as a mask, the junction between the first blocking pattern 131 and the first transport pattern 132 and a boundary of the first electrode 14 can be aligned in a normal direction of the base substrate 11, or the distance between the orthographic projection of the junction between the first blocking pattern 131 and the first transport pattern 132 and the orthographic projection boundary of the first electrode 14 on the base substrate 11 is less than or equal to 1 micron: or, the junction between the first blocking pattern 131 and the first transport pattern 132 is indented (as shown in FIG. 1) relative to the boundary of the first electrode 14. An indented amount may be greater than or equal to 0.5 micron and less than or equal 5 microns.

Figure 3:
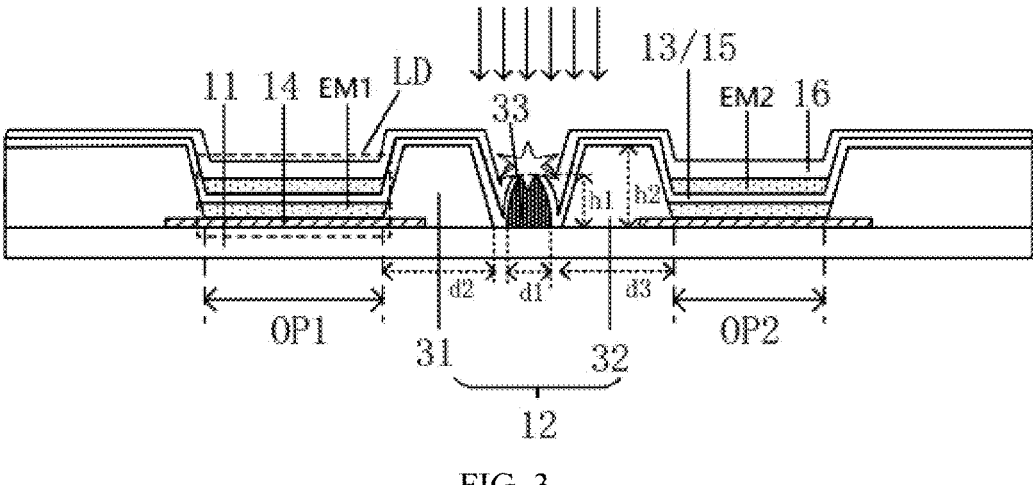
FIG. 3 schematically shows a schematic sectional structural diagram of a second display substrate provided by the present disclosure.

Optionally, referring to FIG. 3, the at least two adjacent opening areas OP include a first opening area OP1 and a second opening area OP2, and the pixel defining layer 12 arranged between the first opening area OP1 and the second opening area OP2 includes a first defining portion 31 and a second defining portion 32 separated from each other.

As shown in FIG. 3, an isolation column 33 is further arranged between the first defining portion 31 and the second defining portion 32, the first defining portion 31 is located between the isolation column 33 and the first opening area OP1, and the second defining portion 32 is located between the isolation column 33 and the second opening area OP2. The orthographic projection of the first blocking pattern 131 and an orthographic projection of the isolation column 33 on the base substrate 11 intersect or overlap.

The isolation column 33 is made of a material that can absorb laser light. After absorbing the laser energy, the isolation column 33 expands or even breaks. Because the orthographic projection of the first blocking pattern 131 and the orthographic projection of the isolation column 33 on the base substrate 11 intersect or overlap, the first blocking pattern 131 at the corresponding position may be fractured when the isolation column 33 breaks, which can further increase the lateral resistance of the first blocking pattern 131.

Optionally, a surface height of the isolation column 33 at the side away from the base substrate 11 is lower than surface heights of the first defining portion 31 and the second defining portion 32 at the side away from the base substrate 11. By arranging the isolation column 33 with a lower height, the first defining portion 31 and the second defining portion 32 which are higher at the two sides can shield particles generated during the breaking of the isolation column 33 or the fracture of the first blocking pattern 131, to prevent the particles from sputtering to the first opening area OP1 or the second opening area OP2, and reduce the influence on the light emitting device.

Optionally, the surface height h1 of the isolation column 33 at the side away from the base substrate 11 may be 30% to 90% of the surface height h2 of the first defining portion 31 or the second defining portion 32 away from the base substrate 11.

Optionally, a dimension d1 of the isolation column 33 may be greater than or equal to 1 micron and less than or equal to 10 microns in a plane direction where the base substrate 11 is located.

Optionally, in a direction that a center of the opening area points to an edge of the opening area, a dimension d2 of the first defining portion 31 may be greater than or equal to 8 microns and less than or equal to 23 microns.

Optionally, in the direction that the center of the opening area points to the edge of the opening area, a lateral dimension d3 of the second defining portion 32 may be greater than or equal to 8 microns and less than or equal to 23 microns.

Optionally, the isolation column 33 and the first defining portion 31 are separated from each other, and the isolation column 33 and the second defining portion 32 are separated from each other. In this way, it is possible to avoid the influence of heat accumulation in the isolation column 33 on the first defining portion 31 and the second defining portion 32.

Optionally, the isolation column 33 is made of the same material as the pixel defining layer 12. Since the isolation columns 33 and the pixel defining layer 12 are arranged in the same layer and made of the same material, the isolation columns 33 and the pixel defining layer 12 can be formed synchronously by the same patterning process, thus simplifying the process.

In this case, longitudinal sections (i.e., sections perpendicular to the base substrate 11) of the isolation column 33, the first defining portion 31 and the second defining portion 32 may have the same shape, such as a trapezoid.

Optionally, a surface of the isolation column 33 at one side away from the base substrate 11 may be flat or cambered (as shown in FIG. 3), which is not limited by the present disclosure.

Certainly, the materials of the isolation columns 33 and the pixel defining layer 12 may also be different, which is not limited by the present disclosure.

Optionally, the common transport layer 13 includes at least one of the following: membrane layers such as a hole injection layer, a hole transport layer, a charge generation layer, a light emitting layer, an electron transport layer and an electron injection layer that are arranged in layer configuration.

In an optional implementation, the membrane layers such as the hole injection layer, the hole transport layer, the charge generation layer, the electron transport layer and the electron injection layer may be formed by an Open Mask through evaporation. The light emitting layer may be formed by a fine metal mask (FMM) through vapor deposition. In the actual process of vapor deposition of the light emitting layer, due to vapor deposition deviation, the light emitting layers in different opening areas OP may lap with each other.

In an optional implementation, the light emitting device LD may include one light emitting layer, and may also include a plurality of light emitting layers that are arranged in layer configuration in a normal direction of the base substrate 11. As shown in FIG. 1 or FIG. 3, the light emitting device LD includes a first light emitting layer EM1 and a second light emitting layer EM2 which are arranged in layer configuration. The first light emitting layer EM1 and the second light emitting layer EM2 are connected in series with each other through a charge generation layer 15 to form a series light emitting device LD.

In this case, the common transport layer 13 includes the charge generation layer 15. Since the charge generation layer 15 is more conductive, the signal crosstalk problem between different sub-pixels can be improved more significantly by setting the first blocking pattern 131 in the charge generation layer.

In the series light emitting device LD, the charge generation layer 15 may inject carriers (such as holes or electrons) into an adjacent light emitting layer, thus reducing interlayer barrier of a plurality of light emitting layers. As shown in FIG. 1 or FIG. 3, for the first light emitting layer EM1, a part of carriers are provided by the first electrode 14 and a second electrode layer 16, and the other part of carriers are generated in the charge generating layer 15. Therefore, the series light emitting device LD has the advantages of long service life and low power consumption.

Figure 4:
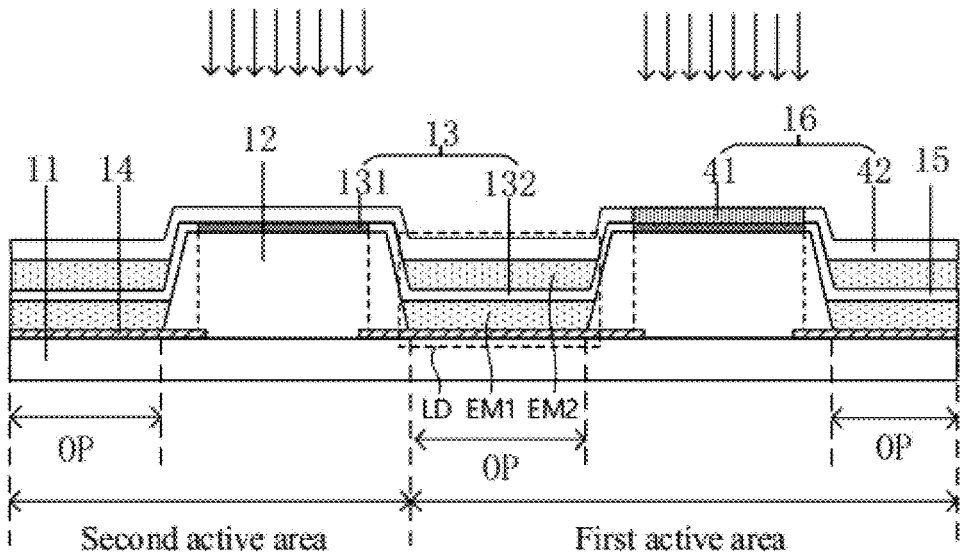
FIG. 4 schematically shows a schematic sectional structural diagram of a third display substrate provided by the present disclosure.

In some examples, referring to FIG. 4, the display substrate may further include: the second electrode layer 16 arranged at one side of the common transport layer 13 away from the base substrate 11.

As shown in FIG. 4, the second electrode layer 16 includes a second blocking pattern 41 and second transport patterns 42 located at two sides of the second blocking pattern 41. A thickness of the second blocking pattern 41 is less than a thickness of the second transport pattern 42.

An orthographic projection of the second blocking pattern 41 on the base substrate 11 is located within an orthographic projection range of the pixel defining layer 12 on the base substrate 11, and an orthographic projection of the second transport pattern 42 on the base substrate 11 covers orthographic projections of at least two adjacent opening areas OP on the base substrate 11 and an orthographic projection of at least part of the pixel defining layer 12 between the at least two adjacent opening areas OP on the base substrate 11.

In an optional implementation, a layer of the second electrode material may be formed by evaporation at one side of the common transport layer 13 away from the base substrate 11, and an orthographic projection of the second electrode material on the base substrate 11 can cover the base substrate 11. After that the second electrode material in the second blocking pattern 41 may be treated by the laser ablation, chemical etching or ion implantation, such that the second electrode material in the second blocking pattern 41 is gasified, such that the thickness of the second blocking pattern 41 can be reduced.

In another optional implementation, a common transport material may be formed at one side of the pixel defining layer 12 away from the base substrate 11 first, and an orthographic projection of the common transport material on the base substrate 11 covers the base substrate 11. After that, a second electrode material is formed at one side of the common transport material away from the base substrate 11, and an orthographic projection of the second electrode material on the base substrate 11 covers the base substrate 11. After that, the common transport material and the second electrode material can be synchronously processed by the same process to form the common transport layer 13 and the second electrode material 12.

For example, the common transport material and the second electrode material may be irradiated with laser at the same time. The common transport material irradiated by the laser constitutes the first blocking pattern 131, and the common transport material not irradiated by the laser constitutes the first transport pattern 132. The second electrode material irradiated by the laser constitutes the second blocking pattern 41, and the second electrode material not irradiated by the laser constitutes the second transport pattern 42.

Illustratively, the second electrode material is a magnesium-silver alloy. When the second electrode material is irradiated by the laser, magnesium and silver elements in the second electrode material may be gasified, which may reduce the thickness of the second electrode material after the laser irradiation. Because the silver element is more likely to gasify than the magnesium element, a proportion of the silver element in the second electrode material after the laser irradiation may decrease. When the second electrode material includes a magnesium-silver alloy, a proportion of the silver in the second blocking pattern 41 may be less than a proportion of the silver in the second transport pattern 42.

Optionally, the orthographic projection of the first blocking pattern 131 on the base substrate 11 at least partially intersects or overlaps with the orthographic projection of the second blocking pattern 41 on the base substrate 11.

For example, the orthographic projection of the first blocking pattern 131 on the base substrate 11 may be located within the orthographic projection range of the second blocking pattern 41 on the base substrate 11, or the orthographic projection of the first blocking pattern 131 on the base substrate 11 may cover the orthographic projection of the second blocking pattern 41 on the base substrate 11, or the orthographic projection of the first blocking pattern 131 on the base substrate 11 may completely intersects or overlaps with the orthographic projection of the second blocking pattern 41 on the base substrate 11.

Optionally, a boundary of the second transport pattern 42 includes at least one of the following: sawtooth, warping, curling, fraze and burr.

The boundary of the second transport pattern 42 may warp toward a direction close to the base substrate 11 or away from the base substrate 11. When a laser process is used, a warping direction of the boundary of the second transport pattern 42 is the same as a laser irradiation direction. For example, when the laser is irradiated from one side of the second electrode layer 16 away from the base substrate 11, the boundary of the second transport pattern 42 warps toward the direction close to the base substrate 11. When the laser is irradiated from one side of the base substrate 11 away from the second electrode layer 16, the boundary of the second transport pattern 42 warps toward the direction away from the base substrate 11.

In a normal direction of the base substrate 11, a dimension of the boundary warpage of the second transport pattern 42 may be greater than or equal to 100 nm. 200 nm or 500 nm, for example.

Figure 7:
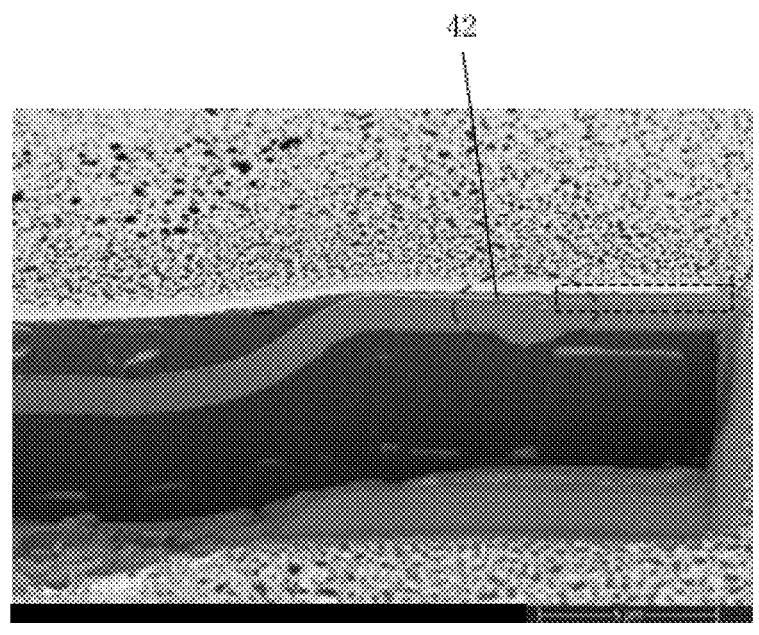
FIG. 7 schematically shows a structural diagram of a first partial section of the display substrate provided by the present disclosure.
Figure 8:
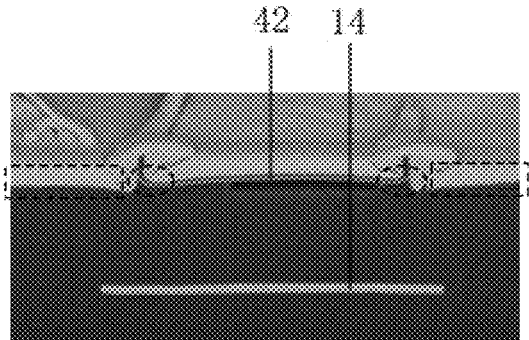
FIG. 8 schematically shows a structural diagram of a second partial section of the display substrate provided by the present disclosure.

Referring to FIG. 7. FIG. 7 shows a structural diagram of a first partial section of the display substrate. As shown in FIG. 7, an oval dashed frame shows that the boundary of the second transport pattern 42 warps downward and the second blocking pattern 41 is located in a rectangular dashed frame at a right side of the second transport pattern 42. A thickness of the second blocking pattern 41 is much less than a thickness of the second transport pattern 42, and the thickness of the second blocking pattern 41 shown in FIG. 7 is very thin and almost invisible. Referring to FIG. 8. FIG. 8 shows a structural diagram of a second partial section of the display substrate. As shown in FIG. 8, an oval dashed frame shows that the boundary of the second transport pattern 42 warps upward and the second blocking pattern 41 is located in rectangular dashed frames at a left side and a right side of the second transport pattern 42. A thickness of the second blocking pattern 41 is much less than a thickness of the second transport pattern 42, and similar to FIG. 7, the thickness of the second blocking pattern 41 shown in FIG. 8 is very thin and almost invisible.

Figure 5:
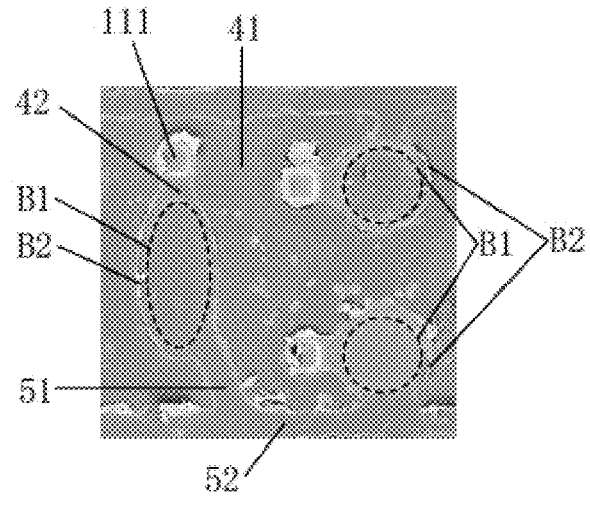
FIG. 5 schematically shows a structural diagram of a plane of a display substrate provided by the present disclosure.

Referring to FIG. 5. FIG. 5 shows structural diagram of a plane of the display substrate. As can be seen from FIG. 5, the boundary of the second transport pattern 42 (B2 position shown in FIG. 5) has irregular sawtooth, curling, fraze and burr.

In FIG. 5. B1 is a boundary of the opening area OP and the non-opening area. B2 is the junction between the second blocking pattern 41 and the second transport pattern 42, or the boundary of the second transport pattern 42, and may also be the junction between the first blocking pattern 131 and the first transport pattern 132, or the boundary of the first transport pattern 132.

Referring to FIG. 4, when the boundary of the second transport pattern 42 warps toward the direction close to the base substrate 11, the warping of the boundary of the second transport pattern 42 can play a role in cutting off the common transport layer 13, thereby achieving an effect of isolating the first blocking pattern 131 from the first transport pattern 132 and further increasing a contact resistance between the first blocking pattern 131 and the first transport pattern 132.

Optionally, the boundary of the first transport pattern 132 and the boundary of the second transport pattern 42 warp toward the same direction. Since the warping directions of the boundary of the first transport pattern 132 and the boundary of the second transport pattern 42 are both the same as a laser irradiation direction, when the common transport material and the second electrode material are irradiated by the laser at the same time, that the boundary of the first transport pattern 132 and the boundary of the second transport pattern 42 can warp toward the same direction can be realized.

Optionally, the second blocking pattern 41 and the second transport pattern 42 at least have one same material.

For example, when the material of the second transport pattern 42 includes magnesium, the second blocking pattern 41 may include magnesium particles. When the material of the second transport pattern 42 includes silver, the second blocking pattern 41 may include silver particles.

Optionally, as shown in FIG. 5, the second blocking pattern 41 is a non-closed structure surrounding the opening area OP by one circle, and the second electrode layer 16 further includes connecting lines 51 and a signal line 52. The connecting lines 51 are configured for communicating the second transport pattern 42 and the signal line 52. In this way, signal transmission between the signal line 52 and the second transport pattern 42 can be achieved.

When the second blocking pattern 41 and the first blocking pattern 131 are formed by the same laser process, and the second blocking pattern 41 is a non-closed structure surrounding the opening area OP by one circle, correspondingly, the first blocking pattern 131 is a non-closed structure surrounding the opening area OP by one circle.

Optionally, the second electrode layer 16 includes a plurality of connecting lines 51, and the plurality of connecting lines 51 are arranged irregularly. In this way, optical diffraction can be reduced and the display quality can be improved.

As shown in FIG. 5, the orthographic projection of the second blocking pattern 41 on the base substrate 11 does not intersect or overlap with a transfer hole 111. Referring to FIG. 4, the transfer hole 111 is a connecting via hole between the first electrode 14 and a corresponding driving circuit (not shown in the figure, located between the base substrate 11 and the first electrode 14 shown in FIG. 4).

Optionally, as shown in FIG. 4, the display substrate includes a first active area and a second active area. The first active area and the second active area are configured for displaying frames, and the first active area is further configured for transmitting ambient light. That is, the first active area is a transparent active area.

The orthographic projection of the second blocking pattern 41 on the base substrate 11 is located within the first active area.

By disposing the second blocking pattern 41 in the second electrode layer 16 in the first active area, a transmittance of the first active area can be improved due to the thickness of the second blocking pattern 41 is thin. Meanwhile, the second electrode layer 16 in the second active area may not be provided with the second blocking pattern, so that a voltage drop of the second electrode layer can be reduced and a signal uniformity can be improved.

The transparent active area can not only display frames, but also transmit the ambient light. The transparent active area can realize display functions such as virtual reality/ augmented reality (VR/AR) and off-screen camera.

It should be noted that the thickness herein refers to a dimension in a direction perpendicular to a plane where a corresponding membrane layer is located. In addition, in the actual process, due to the limitation of process conditions or other factors, similarities of the above features are not exactly the same, and there may be some deviations, so the same relationship between the above features belongs to the protection scope of the present disclosure as long as the above conditions are roughly met. For example, the above-mentioned similarities may be similarities allowed within an allowable range of error.

Figure 10:
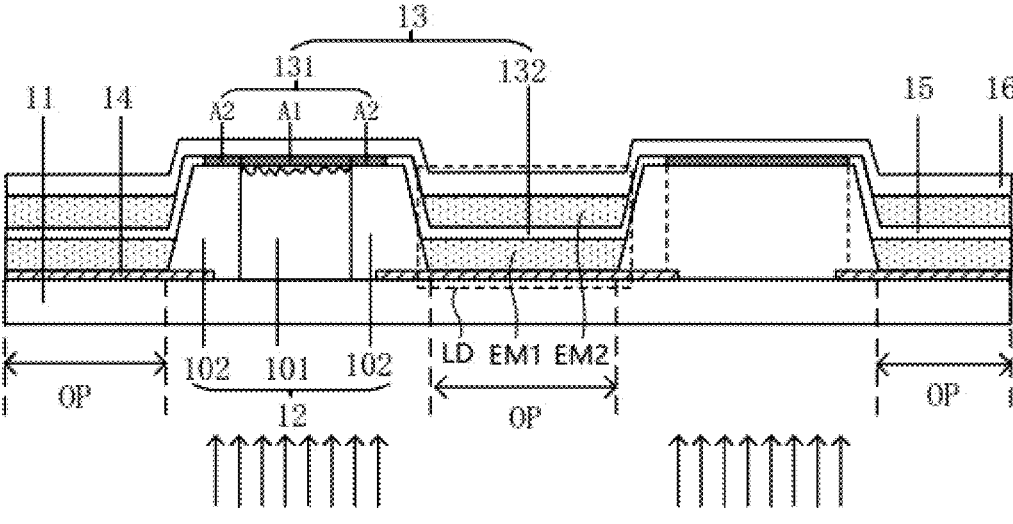
FIG. 10 schematically shows a schematic diagram of a structure of a section of a fourth display substrate provided by the present disclosure.

The present disclosure provides a display substrate. Referring to FIG. 10, FIG. 10 schematically shows a schematic sectional structural diagram of a display substrate according to the present disclosure. As shown in FIG. 10, the display substrate includes: a base substrate 11: a pixel defining layer 12 arranged at one side of the base substrate 11, the pixel defining layer 11 being configured for defining a plurality of opening areas OP; and a common transport layer 13 arranged at one side of the pixel defining layer 12 away from the base substrate 11, including: a first blocking pattern 131 and first transport patterns 132 located at two sides of the first blocking pattern 131, a lateral resistance of the first blocking pattern 131 being greater than a lateral resistance of the first transport pattern 132.

As shown in FIG. 10, the pixel defining layer 12 located between at least two adjacent opening areas OP includes a third defining portion 101 and fourth defining portions 102 located at two sides of the third defining portion 101, wherein a transmittance of the third defining portion 101 is less than a transmittance of the fourth defining portion 102.

As shown in FIG. 10, an orthographic projection of the first blocking pattern 131 on the base substrate 11 is located within an orthographic projection range of the pixel defining layer 12 on the base substrate 11, and an orthographic projection of the first blocking pattern 131 on the base substrate 11 covers an orthographic projection of the third defining portion 101 on the base substrate 11.

As shown in FIG. 10, an orthographic projection of the first transport pattern 132 on the base substrate 11 covers orthographic projections of the at least two adjacent opening areas OP on the base substrate 11, and an orthographic projection of at least part of the pixel defining layer 12 between the at least two adjacent opening areas OP on the base substrate 11.

The lateral resistance of the first blocking pattern 131 is a magnitude of a blocking effect of the first blocking pattern 131 on a lateral current. The lateral resistance of the first transport pattern 132 is a magnitude of a blocking effect of the first transport pattern 132 on the lateral current. The lateral current is the current transmitted in a plane where the common transport layer 13 is located.

Since the lateral resistance of the first blocking pattern 131 is greater than the lateral resistance of the first transport pattern 132, the first blocking pattern 131 plays a role in obstructing or blocking the lateral current.

As the two adjacent opening areas OP are covered with the first transport pattern 132, by arranging the first blocking pattern 131 on the pixel defining layer 12 between the two adjacent opening areas OP, carrier transport between the first transport patterns 132 located at both sides of the first blocking pattern 131 can be blocked, thereby the carrier transport between the two adjacent opening areas OP is blocked, a signal crosstalk problem between sub-pixels corresponding to different opening areas OP is improved, passive lighting of adjacent sub-pixels when a certain sub-pixel is lit, and improving a display effect is avoided.

In specific implementation, a layer of the common transport material may be formed by evaporation at one side of the pixel defining layer 12 away from the base substrate 11, and an orthographic projection of the common transport material on the base substrate 11 can cover the base substrate 11. After that the common transport material in the first blocking pattern 131 may be treated by the process of laser ablation, so that the common transport material in the first blocking pattern 131 is denatured (reactions such as carbonization, oxidation, molecular chain cracking or crosslinking), gasified or subjected to a combination of denaturation and gasification.

Illustratively, the common transport material is an organic material doped with metal element. When the common transport material in the first blocking pattern 131 is irradiated with the laser, the metal element in the common transport material may be gasified or oxidized, which may reduce a thickness of the common transport material after the laser irradiation, or may increase a mass percentage of oxygen, or may reduce a proportion of metal element, all of which can achieve that the lateral resistance of the first blocking pattern 131 is greater than the lateral resistance of the first transport pattern 132.

As shown in FIG. 10, the first blocking pattern 131 includes a central area A1 and an edge area A2 surrounding the central area A1. When the common transport material in the first blocking pattern 131 is irradiated with the laser, laser energy in the central area A1 is larger and laser energy in the edge area A2 is smaller because of the Gaussian distribution of the laser energy, so that a surface material of the pixel defining layer 12 covered by the central area A1 may be ablated, and finally the third defining portion 101 is formed.

Figure 11:
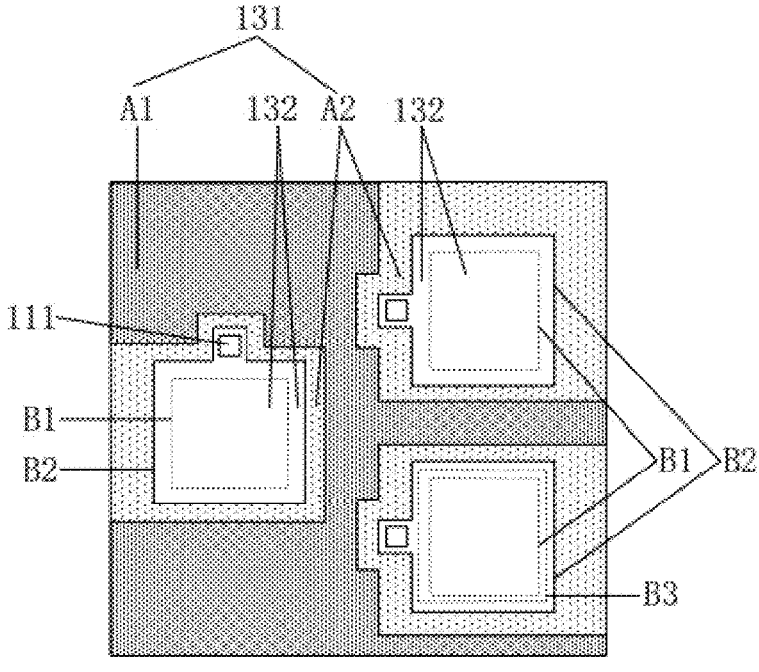
FIG. 11 schematically shows a schematic structural diagram of a plane of the fourth display substrate provided by the present disclosure.

Referring to FIG. 11, FIG. 11 shows a diagram of an orthographic projection of the common transport layer on the base substrate. The central area A1 and the edge area A2 surrounding the central area A1 constitute the first blocking pattern 131. B1 is a boundary of the opening area and a non-opening area, B2 is a junction between the first blocking pattern 131 and the first transport pattern 132, and B3 is a boundary of a first electrode 14.

As shown in FIG. 10 or FIG. 11, the central area A1 is centrally arranged on the first blocking pattern 131. As shown in FIG. 10, an orthographic projection of the third defining portion 101 on the base substrate 11 completely intersects and overlaps with an orthographic projection of the central area A1 on the base substrate 11. Therefore, in FIG. 11, the third defining portion 101 is located in an area covered by the central area A1.

Further, the third defining portion 101 may be centrally arranged between the two adjacent opening areas OP.

As shown in FIG. 11, the fourth defining portion 102 is located in an area covered by the edge area A2 and an area covered by a part of the first transport pattern 132 (that is, the part of the first transport pattern 132 located between the boundary line B1 and the boundary line B2).

In FIG. 11, the first blocking pattern 131 is a closed structure surrounding the opening area OP by one circle, and accordingly, the fourth defining portion 102 may be arranged around the third defining portion 101.

As shown in FIG. 11, the orthographic projection of the first blocking pattern 131 and the orthographic projection of the transfer hole 111 on the base substrate 11 do not intersect or overlap, and the orthographic projection of the third defining portion 101 on the base substrate 11 is located within the orthographic projection range of the first blocking pattern 131 on the base substrate 11, so the orthographic projections of the third defining portion 101 and the transfer hole 111 on the base substrate 11 do not intersect or overlap. Referring to FIG. 10, the transfer hole 111 is a connecting via hole between the first electrode 14 and a corresponding driving circuit (not shown in the figure, located between the base substrate 11 and the first electrode 14 shown in FIG. 10).

Optionally, as shown in FIG. 10, a surface roughness of the third defining portion 101 at the side away from the base substrate 11 is greater than a surface roughness of the fourth defining portion 102 at the side away from the base substrate 11.

As shown in FIG. 10, an upper surface of the third defining portion 101 is provided with a plurality of protrusions and depressions, so a roughness of the upper surface of the third defining portion 101 is greater than a roughness of an upper surface of the fourth defining portion 102.

Optionally, a mass percentage of oxygen of the third defining portion 101 is greater than a mass percentage of oxygen of the fourth defining portion 101.

Optionally, residual particles are present on a surface of the third defining portion 101 at the side away from the base substrate 11, and the residual particles include metal.

The residual particles may include metallic elements such as ytterbium, lithium, copper, molybdenum, neodymium, magnesium and silver, and may also include nonmetallic elements such as fluorine, carbon and oxygen.

Figure 12:
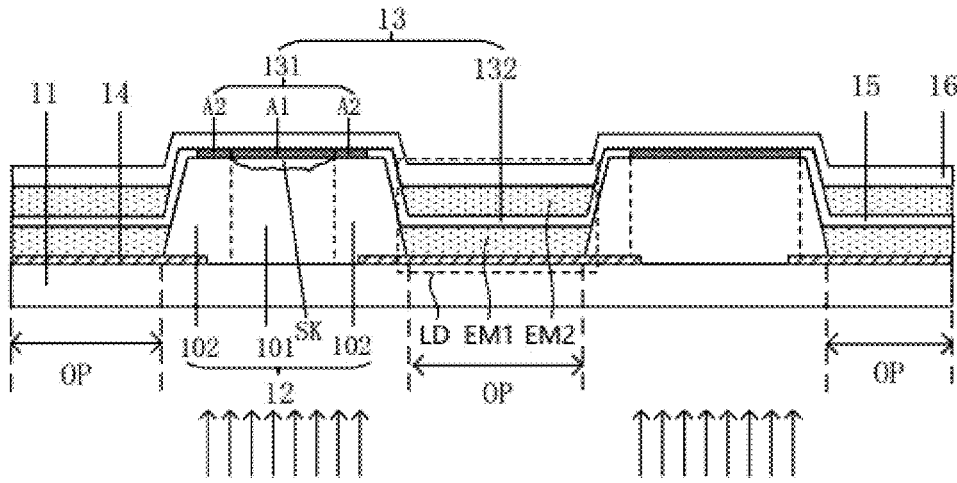
FIG. 12 schematically shows a schematic diagram of a structure of a section of a fifth display substrate provided by the present disclosure.

Optionally, as shown in FIG. 12, a concave structure SK is present on the surface of the third defining portion 101 at the side away from the base substrate 11, and the concave structure SK is concave toward the side close to the base substrate 11. That is, a thickness of the third defining portion 101 is less than a thickness of the fourth defining portion 101.

The present disclosure provides a display device, including the display substrate provided by any embodiment.

As the display device includes the above display substrate, those skilled in the art can understand that the display device has the advantages of the display substrate provided by the present disclosure, which will not be described in detail here.

It should be noted that the display device in the present embodiment may be any product or component with 2D or 3D display function, such as a display panel, electronic paper, a mobile phone, a tablet computer, a TV set, a notebook computer, a digital photo frame, a virtual reality device, an augmented reality device, an off-screen camera device, a navigator, a vehicle-mounted display device, and the like.

The present disclosure provides a method for manufacturing a display substrate. Referring to FIG. 1, the manufacturing method includes the following steps.

Step S01, a base substrate 11 is provided.

Step S02, a pixel defining layer 12 is formed at one side of the base substrate 11, the pixel defining layer 12 being configured for defining a plurality of opening areas OP. The opening area OP is configured for setting a light emitting device LD.

Step S03, a common transport layer 13 is formed at one side of the pixel defining layer 12 away from the base substrate 11.

The common transport layer 13 includes a first blocking pattern 131 and first transport patterns 132 located at two sides of the first blocking pattern 131. The first blocking pattern 131 and the first transport pattern 132 at least include one identical element. A material structure of the first blocking pattern 131 is different from a material structure of the first transport pattern 132, and a lateral resistance of the first blocking pattern 131 is greater than a lateral resistance of the first transport pattern 132.

An orthographic projection of the first blocking pattern 131 on the base substrate 11 is located within an orthographic projection range of the pixel defining layer 12 on the base substrate 11, and an orthographic projection of the first transport pattern 132 on the base substrate 11 covers orthographic projections of at least two adjacent opening areas OP on the base substrate 11 and an orthographic projection of at least part of the pixel defining layer 12 between the at least two adjacent opening areas OP on the base substrate 11.

The display substrate provided by any one of the above embodiments can be prepared by the manufacturing method provided by the present disclosure.

Optionally, the step S03 may specifically include the following steps.

Step S11, a common transport material is formed at one side of the pixel defining layer 12 away from the base substrate 11, an orthographic projection of the common transport material on the base substrate 11 covers the base substrate 11.

Step S12, the common transport material is irradiated with the laser to form the common transport layer 13. The first blocking pattern 131 includes the common transport material irradiated by the laser, and the first transport pattern 132 includes a common transport material not irradiated by the laser.

Figure 9:
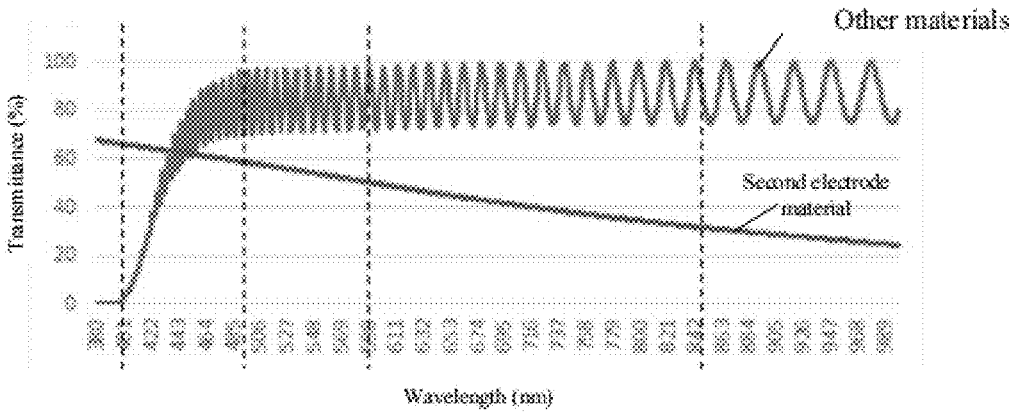
FIG. 9 schematically shows a transmittance curve of different materials for lasers with different wavelengths.

As shown in FIG. 9, different materials have different transmittance for laser with the same wavelength, so a wavelength of laser may be selected accordingly, such that a membrane layer to be cut has a higher absorption rate for laser (corresponding to a lower transmittance), and a membrane layer not to be cut has a lower absorption rate for laser (corresponding to a higher transmittance).

The common transport material is irradiated with laser to form the first blocking pattern 131 and the first transport pattern 132 without adding a mask, which can reduce the cost and simplify the process. A positioning accuracy of laser irradiation is high, so that influences on the light emitting device in the opening area can be avoided.

It should be noted that the formation of the common transport layer 13 is not limited to the above-mentioned laser treatment, and the common transport material may also be treated by ion implantation, chemical etching and other processes to form the common transport layer 13. Optionally, the step S03 may specifically include the following steps.

Step S21, a common transport material is formed at one side of the pixel defining layer 12 away from the base substrate 11, an orthographic projection of the common transport material on the base substrate 11 covers the base substrate 11.

Step S22, a second electrode material is formed at one side of the common transport material away from the base substrate 11, and an orthographic projection of the second electrode material on the base substrate 11 covers the base substrate 11.

Step S23, the common transport material and the second electrode material are irradiated with laser at a same time, to form the common transport layer 13 and the second electrode layer 16.

The first blocking pattern 131 includes the common transport material irradiated by the laser, and the first transport pattern 132 includes a common transport material not irradiated by the laser. The second electrode layer 16 includes a second blocking pattern 41 and second transport patterns 42 located at two sides of the second blocking pattern 41. The second blocking pattern 41 includes the second electrode material irradiated by the laser, and the second transport pattern 42 includes a second electrode material not irradiated by the laser.

It should be noted that the formation of the common transport layer 13 and the second electrode layer 16 are not limited to the above-mentioned laser treatment. The common transport material and the second electrode material may also be treated by ion implantation, chemical etching and other processes to synchronously form the common transport layer 13 and the second electrode layer 16.

Optionally, if a wavelength of the laser is greater than or equal to 500 nm, the laser may be injected from one side of the base substrate 11 away from the common transport material (i.e., front irradiation), as shown in FIG. 3 and FIG.

4. In this case, the laser energy is high, and the front irradiation can avoid damage to a light emitting device.

Optionally, if the wavelength of the laser is greater than 500 nm, the laser may be injected from one side of the base substrate 11 away from the common transport material (i.e., back irradiation), as shown in FIG. 1: or, injected from one side of the base substrate 11 away from the common transport material (i.e., front irradiation): or, injected from one side of the base substrate 11 away from the common transport material (i.e., back irradiation) and one side of the common transport material away from the base substrate 11 (i.e., front irradiation).

It should be noted that an irradiation direction of the laser may be determined according to the wavelength of the laser, absorption of the laser by a membrane layer in the display substrate and other factors, and is not limited by the present disclosure.

In the description of the present disclosure, the meaning of "a plurality of" is two or more than two, and the meaning of "at least one" means one or more, unless otherwise specifically defined.

In the present disclosure, the orientation or positional relationship indicated by the terms "upper" and "lower" is based on the orientation or positional relationship shown in the drawings, only for the convenience of describing the present disclosure and simplifying the description, and does and not indicate or imply that the indicated device or element must have a specific orientation, or be constructed and operated in a specific orientation. Therefore, the terms should not be construed as limiting the present disclosure.

In the claims, any reference signs between parentheses should not be construed as limiting the claims.

Relational terms herein such as first and second, etc., are used merely to distinguish one entity or operation from another entity or operation, and do not necessarily require or imply there is any such relationship or order between these entities or operations. Furthermore, the terms "including", "including" or any variations thereof are intended to embrace a non-exclusive inclusion, such that a process, method, article, or terminal device including a plurality of elements includes not only those elements but also includes other elements not expressly listed, or also incudes elements inherent to such a process, method, article, or device. In the absence of further limitation, an element defined by the phrase "including a . . . " does not exclude the presence of additional identical element in the process, method, article, or terminal device.

The display substrate and the manufacturing method thereof, and the display device provided by the present application are described in detail above. Specific examples are applied to explain the principle and implementation of the present application herein. The above embodiments are only used to help understand the method of the present application and the core idea thereof.

The various embodiments in this specification are described in a progressive manner. Each embodiment focuses on the differences from the other embodiments, and the same or similar parts between the various embodiments may be referred to each other.

The "one embodiment", "an embodiment" or "one or more embodiments" as used herein means that particular features, structures or characteristics described with reference to an embodiment are included in at least one embodiment of the present disclosure. Moreover, it should be noted that here an example using the wording "in an embodiment" does not necessarily refer to the same one embodiment.

The description provided herein describes many concrete details. However, it can be understood that the embodiments of the present disclosure may be implemented without those concrete details. In some of the embodiments, well-known processes, structures and techniques are not described in detail, so as not to affect the understanding of the description.

The present disclosure is intended to cover any variations, uses, or adaptive changes of the present disclosure. These variations, uses, or adaptive changes follow the general principles of the present disclosure and include common general knowledge or conventional technical means in the technical field, which are not disclosed herein. The specification and the embodiments are considered as being exemplary only, with a true scope and spirit of the present disclosure being indicated by the following claims.

The invention claimed is:

1. A display substrate, comprising:
a base substrate;
a pixel defining layer arranged at one side of the base substrate, the pixel defining layer being configured for defining a plurality of opening areas; and
a common transport layer arranged at one side of the pixel defining layer away from the base substrate, comprising: a first blocking pattern and first transport patterns located at two sides of the first blocking pattern, wherein:
the first blocking pattern and the first transport pattern at least comprise one identical element, a material structure of the first blocking pattern is different from a material structure of the first transport pattern, and a lateral resistance of the first blocking pattern is greater than a lateral resistance of the first transport pattern;
an orthographic projection of the first blocking pattern on the base substrate is located within an orthographic projection range of the pixel defining layer on the base substrate, and an orthographic projection of the first transport pattern on the base substrate covers orthographic projections of at least two adjacent opening areas on the base substrate and an orthographic projection of at least part of the pixel defining layer between the at least two adjacent opening areas on the base substrate;
after the first blocking pattern is irradiated with laser, a thickness of the first blocking pattern is less than or equal to a thickness of the first transport pattern; and
a mass percentage of oxygen in the first blocking pattern is higher than a mass percentage of oxygen in the first transport pattern.

2. The display substrate according to claim 1, wherein the first blocking pattern and the first transport pattern are separated from each other at a junction position.

3. The display substrate according to claim 1, wherein a boundary of the first transport pattern comprises at least one of the following: sawtooth, warping, curling, fraze and burr.

4. The display substrate according to claim 1, wherein the first blocking pattern is a closed structure or a non-closed structure surrounding the opening area by one circle.

5. The display substrate according to claim 1, wherein the first blocking pattern comprises a central area and an edge area surrounding the central area;
wherein a thickness of the pixel defining layer covered by the central area is less than or equal to a thickness of the pixel defining layer covered by the edge area; or, a mass percentage of oxygen in a surface layer of the pixel defining layer covered by the central area is higher than a mass percentage of oxygen in a bottom layer of the pixel defining layer.

6. The display substrate according to claim 1, wherein the display substrate further comprises:

a first electrode layer arranged between the base substrate and the pixel defining layer, comprising a first electrode, wherein an orthographic projection of the first electrode on the base substrate covers an orthographic projection of a first opening area on the base substrate, and the first opening area is any one of the at least two adjacent opening areas;

wherein a distance between an orthographic projection of a junction between the first blocking pattern and the first transport pattern on the base substrate and an orthographic projection boundary of the first electrode on the base substrate is less than or equal to 2 microns; or, the orthographic projection of the junction between the first blocking pattern and the first transport pattern on the base substrate is indented toward a direction close to the first opening area relative to the orthographic projection boundary of the first electrode on the base substrate.

7. The display substrate according to claim 1, wherein the at least two adjacent opening areas comprise a first opening area and a second opening area, and the pixel defining layer arranged between the first opening area and the second opening area comprises: a first defining portion and a second defining portion separated from each other;

wherein an isolation column is further arranged between the first defining portion and the second defining portion, the first defining portion is located between the isolation column and the first opening area, and the second defining portion is located between the isolation column and the second opening area; and the orthographic projection of the first blocking pattern and an orthographic projection of the isolation column on the base substrate intersect or overlap.

8. The display substrate according to claim 7, wherein a surface height of the isolation column at the side away from the base substrate is lower than surface heights of the first defining portion and the second defining portion at the side away from the base substrate.

9. The display substrate according to claim 7, wherein the isolation column and the first defining portion are separated from each other, and the isolation column and the second defining portion are separated from each other.

10. The display substrate according to claim 7, wherein the isolation column is made of a same material as the pixel defining layer.

11. The display substrate according to claim 1, wherein the common transport layer comprises at least one of the followings: a hole injection layer, a hole transport layer, a charge generation layer, a light emitting layer, an electron transport layer and an electron injection layer that are arranged in layer configuration.

12. The display substrate according to claim 1, wherein the display substrate further comprises:

a second electrode layer arranged at one side of the common transport layer away from the base substrate, comprising: a second blocking pattern and second transport patterns located at two sides of the second blocking pattern;

wherein a thickness of the second blocking pattern is less than a thickness of the second transport pattern; and an orthographic projection of the second blocking pattern on the base substrate is located within the orthographic projection range of the pixel defining layer on the base substrate, and an orthographic projection of the second transport pattern on the base substrate covers the orthographic projections of the at least two adjacent opening areas on the base substrate and the orthographic projection of at least part of the pixel defining layer between the at least two adjacent opening areas on the base substrate.

13. The display substrate according to according to claim 12, wherein the orthographic projection of the first blocking pattern on the base substrate at least partially intersects or overlaps with the orthographic projection of the second blocking pattern on the base substrate.

14. A display device, comprising the display substrate according to claim 1.

15. A display substrate, comprising:

a base substrate;

a pixel defining layer arranged at one side of the base substrate, the pixel defining layer being configured for defining a plurality of opening areas, and the pixel defining layer located between at least two adjacent opening areas comprising: a third defining portion and fourth defining portions located at two sides of the third defining portion, wherein a transmittance of the third defining portion is less than a transmittance of the fourth defining portion; and a common transport layer arranged at one side of the pixel defining layer away from the base substrate, comprising: a first blocking pattern and first transport patterns located at two sides of the first blocking pattern, a lateral resistance of the first blocking pattern being greater than a lateral resistance of the first transport pattern, wherein:

an orthographic projection of the first blocking pattern on the base substrate is located within an orthographic projection range of the pixel defining layer on the base substrate, and an orthographic projection of the first blocking pattern on the base substrate covers an orthographic projection of the third defining portion on the base substrate;

an orthographic projection of the first transport pattern on the base substrate covers orthographic projections of the at least two adjacent opening areas on the base substrate, and an orthographic projection of at least part of the pixel defining layer between the at least two adjacent opening areas on the base substrate;

after the first blocking pattern is irradiated with laser, a thickness of the first blocking pattern is less than or equal to a thickness of the first transport pattern; and a mass percentage of oxygen in the first blocking pattern is higher than a mass percentage of oxygen in the first transport pattern.

16. The display substrate according to claim 15, wherein a surface roughness of the third defining portion at one side away from the base substrate is greater than a surface roughness of the fourth defining portion at one side away from the base substrate.

17. The display substrate according to claim 15, wherein a mass percentage of oxygen of the third defining portion is greater than a mass percentage of oxygen of the fourth defining portion.

18. The display substrate according to claim 15, wherein residual particles are present on a surface of the third defining portion at the side away from the base substrate, and the residual particles comprise metal.

19. The display substrate according to claim 15, wherein a concave structure is present on a surface of the third defining portion at the side away from the base substrate, and the concave structure is concave toward a side close to the base substrate.

20. A method for manufacturing a display substrate, comprising:

providing a base substrate;

forming a pixel defining layer at one side of the base substrate, the pixel defining layer being configured for defining a plurality of opening areas;

forming a common transport layer at one side of the pixel defining layer away from the base substrate, the common transport layer comprising: a first blocking pattern and first transport patterns located at two sides of the first blocking pattern;

wherein the first blocking pattern and the first transport pattern at least comprise one identical element, a material structure of the first blocking pattern is different from a material structure of the first transport pattern, and a lateral resistance of the first blocking pattern is greater than a lateral resistance of the first transport pattern; and an orthographic projection of the first blocking pattern on the base substrate is located within an orthographic projection range of the pixel defining layer on the base substrate, and an orthographic projection of the first transport pattern on the base substrate covers orthographic projections of at least two adjacent opening areas on the base substrate and an orthographic projection of at least part of the pixel defining layer between the at least two adjacent opening areas on the base substrate, wherein after the first blocking pattern is irradiated with laser, a thickness of the first blocking pattern is less than or equal to a thickness of the first transport pattern, and wherein a mass percentage of oxygen in the first blocking pattern is higher than a mass percentage of oxygen in the first transport pattern.

* * * * *